(12) United States Patent
Chiesa et al.

(10) Patent No.: US 9,520,356 B1
(45) Date of Patent: Dec. 13, 2016

(54) CIRCUIT WITH REDUCED NOISE AND CONTROLLED FREQUENCY

(71) Applicant: Analog Devices, Inc., Norwood, MA (US)

(72) Inventors: John A. Chiesa, Pelham, NH (US);
Cemin Zhang, Nashua, NH (US);
Byungmoo Min, Lexington, MA (US);
Ekrem Oran, Nashua, NH (US); John N. Poelker, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/849,395

(22) Filed: Sep. 9, 2015

(51) Int. Cl.
| | |
|---|---|
| *H01L 23/522* | (2006.01) |
| *H01L 23/552* | (2006.01) |
| *H01L 23/498* | (2006.01) |
| *H01L 23/66* | (2006.01) |
| *H03L 7/24* | (2006.01) |
| *H01L 21/48* | (2006.01) |

(52) U.S. Cl.
CPC ......... *H01L 23/5226* (2013.01); *H01L 21/486* (2013.01); *H01L 21/4853* (2013.01); *H01L 23/49811* (2013.01); *H01L 23/49827* (2013.01); *H01L 23/49838* (2013.01); *H01L 23/552* (2013.01); *H01L 23/66* (2013.01); *H03L 7/24* (2013.01); *H01L 2223/6683* (2013.01)

(58) Field of Classification Search
CPC .............. H01L 21/4853; H01L 21/486; H01L 23/49811; H01L 23/49827; H01L 23/49838; H01L 23/552; H01L 23/66; H03L 7/24

See application file for complete search history.

(56) References Cited

U.S. PATENT DOCUMENTS

| | | | |
|---|---|---|---|
| 5,087,896 A | 2/1992 | Wen et al. | |
| 5,153,600 A | 10/1992 | Metzler et al. | |
| 5,291,061 A | 3/1994 | Ball | |
| 5,457,068 A * | 10/1995 | Malhi | ............... H01L 21/76297 257/E21.56 |
| 5,942,950 A | 8/1999 | Merenda | |
| 6,100,953 A | 8/2000 | Kim et al. | |
| 6,362,706 B1 * | 3/2002 | Song | ....................... H01P 7/065 333/219 |
| 6,472,747 B2 | 10/2002 | Bazarjani et al. | |

(Continued)

FOREIGN PATENT DOCUMENTS

| | | |
|---|---|---|
| CN | 104218279 A | 12/2014 |
| GB | 2476692 | 7/2011 |

OTHER PUBLICATIONS

Jantuenen, H. et al., "Design Aspects of Microwave Components with LTCC Technique," *Journal of the European Ceramic Society*, vol. 23, (2003) pp. 2541-2548.

(Continued)

*Primary Examiner* — Allan R Wilson
(74) *Attorney, Agent, or Firm* — Knobbe, Martens, Olson & Bear, LLP

(57) ABSTRACT

A die is packaged by flip-chip mounting the die with the active side facing a low loss substrate. A ground plane is coupled to the active side of the die by vias through the low loss substrate. The ground plane is positioned to concentrate high frequency electromagnetic fields in the low loss substrate. A tuning height can be adjusted to tune the center frequency of a circuit in the die.

20 Claims, 6 Drawing Sheets

(56) References Cited

U.S. PATENT DOCUMENTS

| | | | |
|---|---|---|---|
| 6,550,664 B2 | 4/2003 | Bradley et al. | |
| 6,645,790 B2 | 11/2003 | Moghe et al. | |
| 6,778,041 B2 | 8/2004 | Takahashi et al. | |
| 7,671,806 B2 | 3/2010 | Voigtlaender | |
| 7,821,357 B2 | 10/2010 | Heinze et al. | |
| 8,810,322 B2 | 8/2014 | Rangarajan et al. | |
| 8,866,291 B2 | 10/2014 | Alm | |
| 8,941,247 B1 | 1/2015 | Gupta et al. | |
| 8,957,738 B1 | 2/2015 | Koechlin et al. | |
| 2002/0098611 A1* | 7/2002 | Chang | B81C 1/00246 438/50 |
| 2004/0130877 A1* | 7/2004 | Okubora | H01L 23/145 361/793 |
| 2009/0174497 A1* | 7/2009 | Korden | H03H 9/0571 333/100 |
| 2011/0090027 A1* | 4/2011 | Mangaiahgari | H01P 1/268 333/22 R |
| 2012/0228755 A1* | 9/2012 | Nagano | H01L 23/04 257/698 |
| 2014/0211441 A1 | 7/2014 | Tsukizawa | |
| 2016/0099197 A1* | 4/2016 | Uematsu | H01L 23/498 257/759 |

OTHER PUBLICATIONS

Shen, T. et al., "Design of Vertically Stacked Waveguide Filters in LTCC," *IEEE Transactions on Microwave Theory and Techniques*, vol. 55, No. 8, Aug. 2007 pp. 1771-1779.

\* cited by examiner

CIRCUIT WITH REDUCED NOISE AND CONTROLLED FREQUENCY

BACKGROUND

Technical Field

Embodiments of the disclosure relate to electronic systems and, more particularly, to monolithic microwave integrated circuits (MMIC) and resonators.

Description of the Related Technology

Electronic devices can be fabricated as monolithic microwave integrated circuits (MMIC). An MMIC die can be fabricated having an active circuit on one side of the die and a ground plane on an opposite side of the die. Some MMIC's can include resonators and oscillators. It can be desirable to improve the phase noise and to be able to adjust a center frequency of an oscillator.

SUMMARY OF CERTAIN INVENTIVE ASPECTS

One aspect of the disclosure is a packaged chip that includes a packaging substrate, a die, and a ground plane. The packaging substrate includes a first side and a second side, the second side opposing the first side. The die includes a semiconductor substrate that is more lossy than the packaging substrate and a resonator circuit on an active side of the die, the active side facing the first side of the packaging substrate. The ground plane that is external to the die, the ground plane is separated from the resonator circuit by at least a portion of the packaging substrate, and the ground plane being electrically coupled to the die.

In the packaged chip, the ground plane can be the nearest ground plane to the resonator circuit. The die can have no ground planes. The ground plane can be positioned relative to the resonator circuit so as to concentrate radio frequency electromagnetic fields in at least a portion of the packaging substrate. The ground plane and the die can be disposed on the opposite sides of the packaging substrate.

In the packaged chip, a packaging material can be in physical contact with a back side of the die, the back side of the die opposing the active side of the die. A bump can be coupled to the active side of the die such that the active side of the die is separated from the packaging substrate. The packaging substrate can be a laminate substrate. The packaging substrate could be fabricated using standard PCB materials, or could be constructed using at least one of a glass material, a ceramic material; or a ferrite material. The semiconductor substrate can include a doped silicon material. The die can include a microwave monolithic integrated circuit comprising a voltage controlled oscillator that comprises the resonator.

Another aspect of the disclosure is an electronic system that includes a resonator circuit on an active side of a microwave monolithic integrated circuit (MMIC) that comprises a semiconductor substrate, a packaging substrate that is less lossy than the semiconductor substrate, and a ground plane. A positioning of the ground plane relative to the resonator circuit is configured to concentrate microwave frequency electromagnetic fields in at least a portion of the packaging substrate.

In the electronic system, the MMIC can be flip chip mounted so that the active side of the die faces the packaging substrate. The ground plane can be separated from the resonator circuit by at least a part of the packaging substrate. The ground plane and the resonator circuit can be positioned on opposite sides of the packaging substrate.

In the electronic system, a via can extend through at least a portion of the packaging substrate, and the via can provide an electrical connection between the ground plane and the resonator circuit. A bump can be coupled between the active side of the MMIC and the packaging substrate. The MMIC can include a voltage controlled oscillator (VCO) that receives a signal from the resonator circuit, the VCO configured to output a signal that oscillates at a frequency that varies based, at least in part, on a voltage of an input signal.

Another aspect of the disclosure is a chip assembly method. The method includes providing a die comprising a resonator, and flip chip mounting the die on a packaging substrate such that an active side of the die is electrically coupled to a ground plane external to the die by way of a via in the packaging substrate, wherein the packaging substrate has a lower loss than a semiconductor substrate of the die, and wherein a distance from the ground plane to the resonator impacts a center frequency of the resonator.

The method can also include providing a second die that is substantially the same as the die, and flip-chip mounting the second die on a second packaging substrate such that an active side of the second die is electrically coupled to a second ground plane external to the second die by way of a via in the second packaging substrate, wherein the second packaging substrate has a lower loss than a semiconductor substrate of the second die, and wherein a second distance that separates a resonator of the second die from the second ground plane is different than the distance such that the resonator of the second die has a second center frequency that is different than the center frequency.

For purposes of summarizing the disclosure, certain aspects, advantages, and novel features of the inventions have been described herein. It is to be understood that not necessarily all such advantages can be achieved in accordance with any particular embodiment of the invention. Thus, the invention can be embodied or carried out in a manner that achieves or optimizes one advantage or group of advantages as taught herein without necessarily achieving other advantages as can be taught or suggested herein.

DETAILED DESCRIPTION

Figure 1:
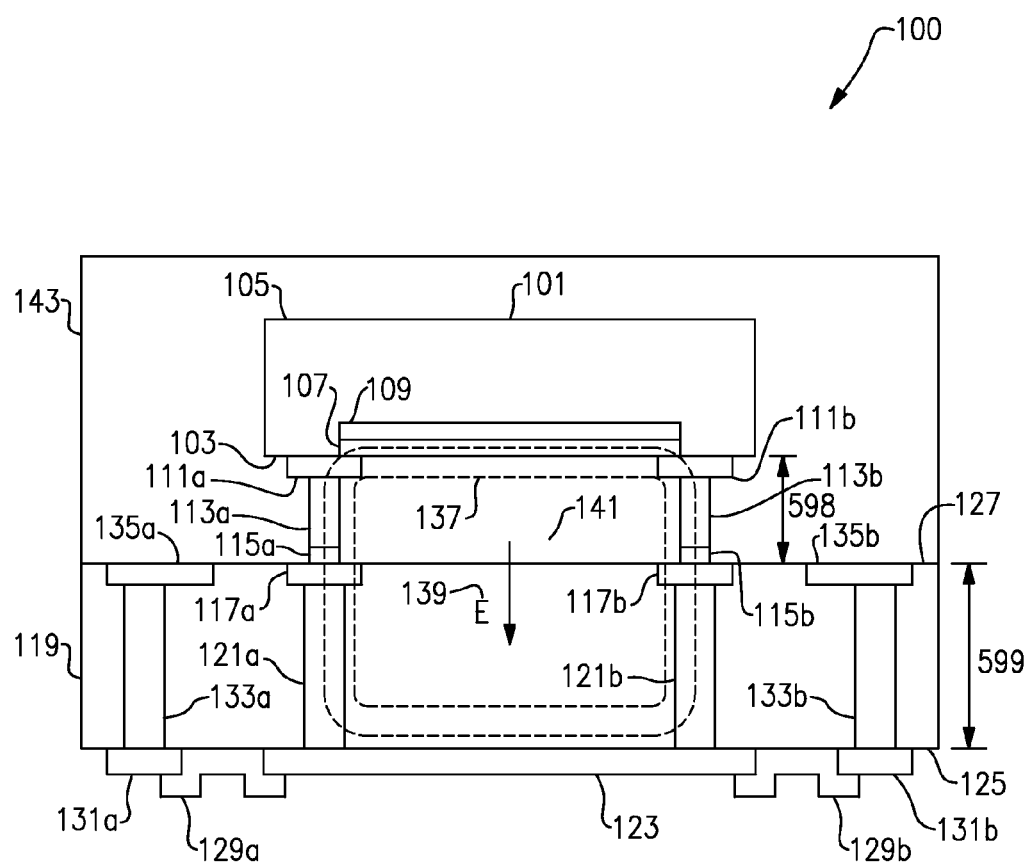
FIG. 1 shows a side view cross section diagram of an illustrative chip according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numbers can indicate identical or functionally similar elements. It will be understood that elements illustrated in the figures are not necessarily drawn to scale. Moreover, it will be understood that certain embodiments can include more elements than illustrated in the drawings and/or a subset of the illustrated elements in a particular drawing. Further, embodiments can incorporate any suitable combination of features from two or more drawings.

A resonator circuit, such as an LC tuned oscillator, can generate a high frequency electromagnetic field. As the electromagnetic field permeates certain materials, it can be affected by the material. This can cause energy losses and contribute to noise. It can be desirable to design a chip with a higher Q factor and/or lower phase noise.

Certain types of materials are inherently more lossy than other materials. For example, a p-doped silicon substrate, such as a p-doped substrate associated with a CMOS process, can have a relatively high substrate loss of approximately 5 to 12 $\Omega$-cm. In general, many semiconductor substrates, including silicon based substrates and their doped variations, as well as other substrates used for various fabrication processes, can have relatively high substrate losses. However, because many circuits are fabricated on dies that have semiconductor substrates, high frequency electromagnetic fields generated by those circuits can permeate the semiconductor substrate and contribute to increased loss.

Other materials can be less lossy than semiconductors. For example, a relatively low loss packaging substrate, such as a laminate substrate, can have a substrate loss exceeding 1000 $\Omega$-cm. The packaging substrate can have a dielectric loss tangent that is no more than about 0.01 at a center frequency of a resonant circuit of the die. In certain implementations, the packaging substrate can have a loss tangent that is no more than about 0.001 at a center frequency of a resonant circuit of the die. This is considered to be a lower loss than the loss of the doped silicon substrate and should be a lower loss than other semiconductor substrates. The packaging substrate can be an electrically insulating substrate.

This disclosure provides techniques and designs that can cause the high frequency electromagnetic field to concentrate in a lower loss packaging substrate instead of in the more lossy die substrate that a resonator is fabricated on. One such feature is flip-chip mounting a die such that circuitry in the active side of the die is facing the lower loss laminate substrate. Positioning the active side of the die closer to a packaging substrate compared to a die with its backside adjacent to a packaging substrate can cause the electromagnetic field to be more concentrated in the low loss packaging substrate.

Although this disclosure may discuss embodiments that include a laminate substrate, the principles and advantages discussed herein can be applied in connection with any suitable packaging substrate that is less lossy than the die substrate. Examples of such a less lossy substrate include ceramic, glass, ferrite, or other electrically insulating substrates. A particular less lossy substrate can be implemented for a desired application. of the less lossy substrate can have The terms "laminate substrate" or "packaging substrate" as generally used herein refer to the substrate of a packaging material that a die can be mounted on, e.g., on a printed circuit board or in a packaged chip.

Another feature of this disclosure is positioning a ground plane to further direct the electromagnetic field generated by a resonator to concentrate in the packaging substrate. Physical layouts can accommodate such a ground plane location. The ground plane can be positioned so that the laminate substrate, in part or in whole, is between the ground plane and the active circuitry. Because the high frequency electromagnetic field should concentrate between the ground plane and the active circuitry, this positioning can cause the high frequency electromagnetic field to concentrate in the laminate substrate. In addition, compared to other flip-chip mounted dies, the ground plane coupled to the active side of the die in embodiments discussed herein can pull heat away from the die, and the ground plane can radiate the heat more effectively due to having a larger surface area than the surface area of the die and/or because of the ground plane's position on or nearer to the outside of a package. Accordingly, a die can be packaged with an overmold fill above the die without a placing a heat sink against the die, thereby simplifying the fabrication process and saving the costs of a heatsink, thermal paste, and assembly labor.

To concentrate the high frequency electromagnetic field in the laminate substrate even more, the ground plane can be the nearest ground plane and/or the only ground plane (thus, inherently the nearest) that is electrically coupled to the die or circuitry. Therefore, the purpose of reducing phase noise can, at least in part, be achieved by positioning the ground plane such that laminate substrate is between the ground plane and the die so that, in principle, the high frequency electromagnetic fields should concentrate more in the lower loss laminate substrate.

In addition, the nearest ground plane can be separated from the resonator by a greater distance than previous designs that used relatively long bond wires in an electrical path between the resonator and ground. Bond wires can introduce more inductance than desired. In embodiments discussed herein, the ground plane can be electrically coupled to the die by way of a shorter route through at least a portion of the laminate using bumps (e.g., solder joints or copper pillars). By distancing the nearest ground plane further from the die, the Q factor can be increased for a resonator, oscillator, or other similar circuit in the die. Increasing the distance between the die and the ground plane can increase the reactance and/or inductance of microstrip lines in the die. The Q factor can increase with reactance divided by a resistance. Therefore, the Q factor can be increased by distancing the die from the nearest ground plane. This can be accomplished without using bond wires.

When a particular inductance value is desired, a microstrip line can have a width and height above the ground plane selected so as to provide the particular inductance value with a higher Q than in previous designs that include wire bonds. Larger structures typically have a higher Q, which can result from more metal for the RF currents to flow through. A higher Q can be achieved by way of widening microstrip width and/or by spacing a resonator a greater distance from the ground plane. This improvement in Q would even be applicable to designs on silicon with low-loss, high-resistivity substrates (e.g., about 1000 $\Omega$-cm) and/or designs on GaAs substrates.

Furthermore, the ground plane on a side of the laminate substrate that opposes the die can replace a ground plane that would otherwise be positioned on the inactive side of the semiconductor substrate. Accordingly, since a ground plane of the die can be omitted, such a ground plane will no longer direct the high frequency electromagnetic field to concentrate in the more lossy semiconductor substrate. If there is another ground plane in an area on the inactive side of the semiconductor substrate in certain implementation, the ground plane in that area can be smaller and/or more distant from the resonator so as to avoid concentrating the high frequency electromagnetic field in the semiconductor substrate. Therefore, the purpose of reducing phase noise can, at least in part, be achieved by omitting or at least redesigning ground planes on the inactive side of the semiconductor substrate so that the high frequency electromagnetic fields should concentrate less in the higher loss semiconductor substrate.

Additionally, the omission of the ground plane on the other side of the semiconductor substrate can eliminate a desire to implement through-semiconductor substrate vias that would otherwise couple the circuitry to the ground plane on the other side of the semiconductor substrate. Vias through the laminate substrate can be easier and cheaper to implement than vias through a semiconductor substrate. Therefore, a purpose of more easily and more cheaply electrically coupling the ground plane can, at least in part, be achieved by coupling the ground plane to vias through the laminate substrate so that the more expensive and more difficult process of fabricating vias through a die to couple to the ground plane can be avoided.

Some embodiments allow the center frequency of a resonator to be tuned without redesigning an active circuit, redesigning the resonator, changing circuit element values (e.g., resistances, capacitances, inductances), or changing input values (e.g., voltages). The center frequency can be tuned by selecting a distance between a resonator and a ground plane. If a resonator is separated by the ground plane by a bump and a via, then the total distance can be adjusted by adjusting the height of the bump or the via. These adjustments can be relatively easier and/or less expensive to implement than redesigning a circuit or changing circuit components to have different values. This allows the same resonator chip to have different center frequencies when assembled in different packages. A first resonator can be used in a first package where the first resonator is spaced from the ground plane by a first distance so that the first resonator has a first center frequency. A second resonator of the same design as the first resonator can be used in a second package, where the second resonator is spaced from the ground plane by a second distance so that the second resonator has a different center frequency. Tuning the center frequency can be used on dies that include a variety of materials such as silicon, GaAs, SiGe, III-V semiconductors, etc.

Resonators have many applications. They can be used, for example, in filters, amplifiers, tuners, mixers, and a variety of other circuits. They can also be used as parts of oscillators, including VCOs such as a push-push Colpitts VCO or a Clapp VCO. The principles and advantages associated with the resonators discussed herein can be implemented in connection with VCOs, fixed oscillators, filters, amplifiers, tuners, mixers, and a variety other suitable circuits with a resonator that could benefit from lower loss.

FIG. 1 is a side view cross section diagram of an illustrative chip 100 according to an embodiment. The chip 100 includes a flip-chip mounted VCO die 101 that is separated from a ground plane 123 by a relatively low loss substrate 119. The chip 100 includes a die 101 having an active side 103 and inactive side 105, the die including first level circuitry 107 and second level circuit 109; bump pads 111a, 111b; bumps 113a, 113b; solder caps 115a, 115b; metallization 117a; 117b, 135a, and 135b; laminate substrate 119 that has a first side 127 and an external side 125; vias 121a, 121b, 133a, and 133b; ground plane 123; solder masks 129a, 129b; input/output (I/O) connectors 131a, 131b; mold underfill 141; and package 143.

A die 101 has an active side 103 and an inactive side 105. The active side 103 includes first level circuitry 107 and second level circuitry 109. The die 101 can implement some or all of a MIMIC. For example, first level circuitry 107 can include a resonator, and second level circuitry 109 can include active circuitry such as active circuitry of a VCO. Parts of the first level circuitry 107 are coupled to bump pads 111a, 111b. The bump pads are coupled to bumps 113a, 113b. The bumps 113a, 113b are coupled by solder caps 115a, 115b to metallization 117a, 117b (also known as "via pads") on a first side 127 of a laminate substrate 119. Vias 121a, 121b through the laminate substrate 119 couple the metallization 117a, 117b to a ground plane 123 on an opposite, external side 125 of the laminate substrate 119. Along the external side 125 of the laminate substrate, solder masks 129a, 129b insulate the ground plane 123 from I/O connectors 131a, 131b. I/O connectors 131a, 131b couple through vias 133a, 133b to via pads 135a, 135b. The via pads 135a, 135b can route through a different cross-sectional view (not shown) and couple to various circuitry of the die 101, for example, by way of solder caps and bump pads to the second level circuitry 109. An example radio frequency ("RF") current path is indicated by the dotted lines 137, and an example electric field 139 is indicated by "E." A mold underfill 141 fills a space between the die 101 and the laminate substrate and can provide structural support for the die 101. A mold overfill encapsulates the die 101 in a package 143.

In FIG. 1, shown vias 121a, 121b go through the laminate substrate 119, not the semiconductor substrate of the die 101. The vias 121a, 121b and bumps 113a, 113b can conduct heat away from the die 101 to the ground plane 123 on the other side of the laminate substrate 119. This allows for the die 101 to be encapsulated by packaging 143 without having a separate heat sink in the package 143 to thermally conduct heat away from the die 101.

In FIG. 1, the ground plane 123 is the only ground plane, and it is the nearest ground plane to the first level circuitry 107 in the active side 105 of the die 101. The ground plane 123 can replace a ground plane that could otherwise be positioned on the inactive side 105 of the die 101. In some embodiments, the ground plane 123 can be a virtual ground plane, and currents can be virtual currents.

In some embodiments, there can be other ground planes. Other ground planes can be located, for example, along the external side 125 of the laminate substrate 119, or inside the laminate substrate 119. For example, mixed analog and digital circuits can have an analog ground plane and a digital ground plane and these ground planes can be disposed within the laminate substrate 119 and/or along external side 125 of the laminate substrate 119. Although FIG. 1 depicts the ground plane 123 on the external side of the laminate substrate 119 with vias 121 extending all the way through the laminate substrate 119 and the entire thickness of the laminate substrate 119 between the ground plane 123 and the die 101, some embodiments can include the portions of the ground plane inside the laminate substrate 119 such that the vias only extend only partway through the laminate substrate 119, and only part of the laminate substrate 119 is between the ground plane and the die 101.

It is possible that a distant ground point can be in a different location. For example, due to routing restrictions, a distant ground plane may occupy an area on the inactive side 105 of the die 101 or otherwise be positioned in the chip package in a way that directs the high frequency electromagnetic field away from the laminate substrate. However, in such a situation, the distant ground plane can be comparatively smaller in size, farther away than the ground plane that concentrates the high frequency electromagnetic field in the laminate substrate, or coupled differently, such that the distant ground plane redirects only a small or negligible amount of high frequency electromagnetic field into the more lossy semiconductor substrate and contributes only to a small or negligible amount of phase noise. The semiconductor substrate of the die can be a SiGe substrate or a GaAs substrate, for example.

In some embodiments, the first level circuitry 107 includes a resonator, which may include microstrip lines. The overall shape of such a resonator can be straight, form a loop, or have other possible configurations. The second level circuitry 109 includes other circuit elements. Some embodiments can include a different number of circuitry layers, different locations for the resonator, or even mix components between different layers.

In some embodiments, the bumps 113a, 113b can be copper pillars, solder balls, solder joints, other solder forms, other metals or conductive structures of suitable shapes, etc.

Figure 2:
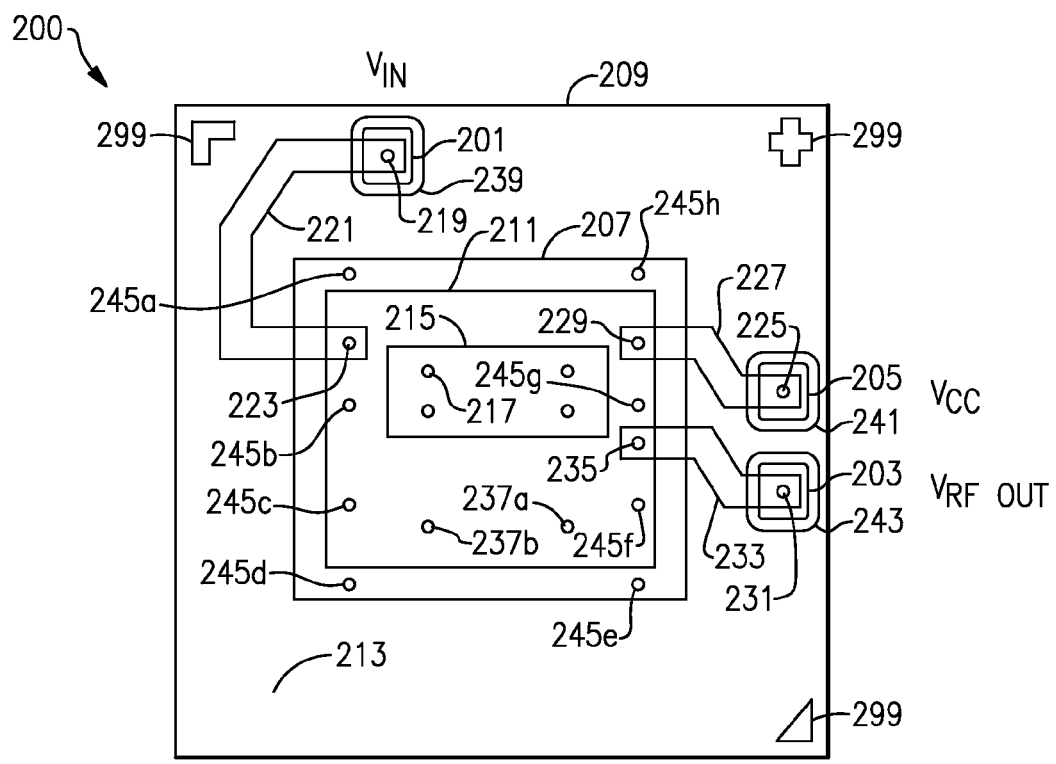
FIG. 2 shows a plan view of an illustrative voltage controlled oscillator (VCO) chip according to an embodiment.

FIG. 2 shows a top-down view of an example voltage controlled oscillator (VCO) chip 200. A input voltage $V_{IN}$ can be supplied at the I/O connector 201 to control a frequency of an output signal $V_{RF}$ at I/O connector 203. A flip-chip mounted die 207 includes active circuitry 211 and a strip resonator 215, which is electrically connected through the laminate substrate 209 by vertical conductive pathways 217 to the grounding plane 213. For clarity of illustration, components are shown as transparent.

A die 207 is flip chip mounted onto a printed circuit board that is made, at least in part, of a laminate substrate 209. The laminate substrate 209 has a lower loss than a semiconductor substrate of the VCO chip 200. The inactive side of the die 207 faces away from the laminate substrate 209. The active side of the die 207 faces the laminate substrate 209. As illustrated, the active side of the die 207 includes a strip resonator 215 and active circuitry 211. Bumps 245a-245h between the die 207 and the laminate substrate 209 support the die 207 above the laminate substrate 209.

The external side of the laminate substrate 209 includes an I/O connector 201 to receive an input voltage that can be adjusted to tune a frequency of an output signal at I/O connector 203. The external side of the laminate substrate 209 can also include a I/O connector 205 for receiving a reference supply voltage. A ground plane 213 covers areas across the external side of the laminate substrate 209 that are not occupied by other components, such as the connectors 201, 203, and 205. Insulators 239, 241, 243 (for example, the solder mask 129 of FIG. 1) surround connectors 201, 203, and 205 to insulate the connectors 201, 203, and 205 from the ground plane 213. Various markers 299 can indicate an orientation of the chip 200.

Vertical conductive pathways 217 couple parts of the strip resonator 215 on the die to the ground plane 213 on the external side of the laminate substrate 209. The vertical conductive pathways 217 of FIG. 2 can include, for example, bump pads 111, bumps 113, solder caps 115, metallization 117, and vias 121 as shown in FIG. 1.

I/O connector 201 on the external side of the laminate substrate 209 is electrically coupled by vertical conductive pathway 219 to a conductive pathway 221 such as a trace, microstrip line, wires, etc. on the first side of the laminate substrate 209. The conductive pathway 221 is coupled by a bump 223 or other electrical connection to a part of the active circuit 211 that receives the tuning voltage.

I/O connector 203 on the external side of the laminate substrate 209 is electrically coupled by vertical conductive pathway 231 to a conductive pathway 233 on the first side of the laminate substrate 209. The conductive pathway 233 is coupled by a bump 235 or other electrical connection to a part of the active circuit 211 that generates the output signal.

I/O connector 205 on the external side of the laminate substrate is electrically coupled by vertical conductive pathway 225 to a conductive pathway 227 on the first side of the laminate substrate 209. The electrical pathway 227 is coupled by a bump 229 or other electrical connection to a part of the active circuit 211 to provide a reference supply voltage.

In some embodiments, vertical conductive pathways 237a, 237b can couple parts of the active circuitry 211 in the die 207 to the ground plane 213 on the external side of the laminate substrate 209. In some embodiments, the strip resonator 215 and active circuitry 211 can be in the same or different layers of the die 207. In some embodiments, the strip resonator 215 can be different shapes or sizes. In some embodiments, the I/O connectors can be any general connector, for example, pads, pins, wires, bonding pads, leads, etc. In some embodiments, the ground plane 213 can have a defined shape (e.g., a rectangle, racetrack, oval) rather than just spanning across otherwise unused area on the external side of the laminate substrate 209.

The VCO chip 200 can be designed to output a range of frequencies. For instance, the VCO chip 200 and/or other resonant circuits discussed herein can output signals with microwave frequencies in the range from about 300 MHz to 300 GHz, such as in the range from about 3 GHz to 30 GHz in certain implementations. As another example, the VCO chip 200 and/or other resonant circuits discussed herein can output RF signals having frequencies in the range from about 30 kHz to 300 GHz, such as in the range from about 400 MHz to 5 GHz, in some implementations. Any of the principles and advantages discussed herein can be applied to resonant circuits that provide RF and/or microwave frequency signals. Different VCOs can be designed to have different center frequencies and different frequency ranges around the center frequency, depending on a desired application.

Figure 3:
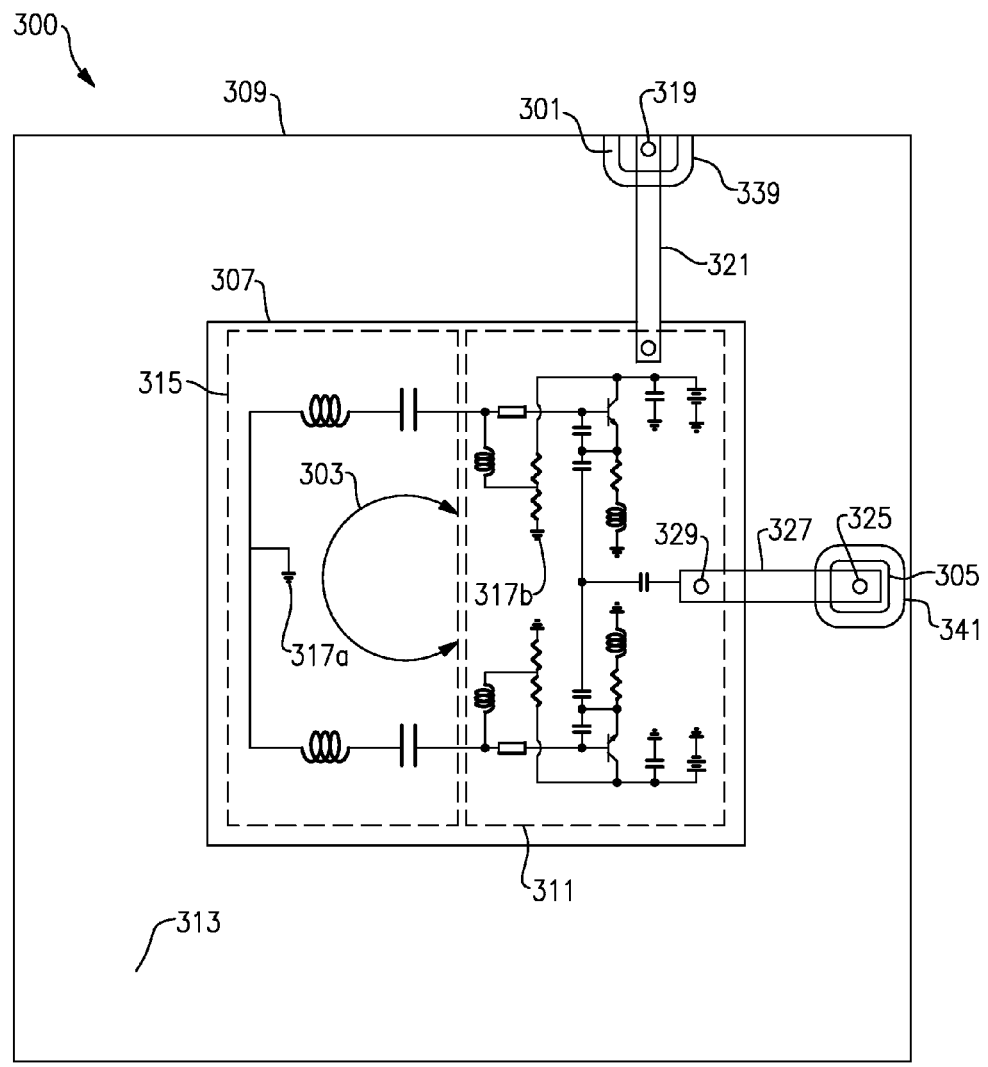
FIG. 3 shows a top-down view of an illustrative VCO chip according to an embodiment.

FIG. 3 shows a top-down view of an example voltage controlled oscillator (VCO) chip 300 according to an embodiment. In the embodiment shown, a flip-chip mounted die 307 includes active circuitry 311 and a horseshoe resonator 315, which is electrically connected through the laminate substrate 309 by vertical conductive pathways to the grounding plane 313. For clarity of illustration, components are shown as transparent.

A die 307 is flip chip mounted onto a printed circuit board that is made, at least in part, of a laminate substrate 309. The inactive side of the die 307 faces away from the laminate substrate 309. The active side of the die 307 faces the laminate substrate 309. The active side of the die 307 includes a horseshoe resonator indicated by the dotted lines 315 (also known as a "race track" or "ring" style resonator) and active circuitry 311. More details regarding the horseshoe resonator 315 and active circuitry 311 will be provided in connection with FIG. 6.

The external side of the laminate substrate 309 includes an I/O connector 301 as illustrated. Such an I/O connector can be used, for example, to receive a supply voltage Vcc, receive a tuning voltage Vtune to tune a varactor diode, etc. The external side of the laminate substrate 309 can also include an I/O connector 305 to output an oscillating voltage. A ground plane 313 covers areas across the external side of the laminate substrate 309 that are not occupied by other components, such as the connectors 301 and 305. Insulators 339 and 341 (for example, solder mask 129 of FIG. 1)

surround connectors 301 and 305 to insulate the connectors 301 and 305 from the ground plane 313.

The horseshoe resonator 315 couples to the ground plane 313 on the external side of the laminate substrate 309 as depicted by schematic ground symbols, for example 317a, 317b. This can happen by way of vertical conductive pathways that can include, for example, bump pads 111, bumps 113, solder caps 115, metallization 117, and vias 121 as shown in FIG. 1. When active, RF energy can circulate or oscillate along the path 303. Although RF pathway 303 is oriented differently from the RF pathway 137 shown in FIG. 1, the RF pathway 303 can still be concentrated in the laminate substrate 309 rather than in the lossier semiconductor substrate of the VCO chip 300.

The I/O connector 301 on the external side of the laminate substrate 309 is electrically coupled by vertical conductive pathway 319 to a conductive pathway 321 such as a trace, microstrip line, wires, etc. on the first side of the laminate substrate. The conductive pathway 321 is coupled to an appropriate part of the circuit depending on the signal received at by way of I/O connector 301.

I/O connector 305 on the external side of the laminate substrate is electrically coupled by vertical conductive pathway 325 to a conductive pathway 327 on the first side of the laminate substrate. The electrical pathway 327 is coupled by a bump 329 or other electrical connection to a part of the active circuit 311 that generates the output signal.

While FIG. 3 illustrates a different embodiment compared to FIG. 2, any of the principles and advantages of these figures can be combined in other embodiments. For instance, the features shown in FIG. 3 can be implemented in connection with features shown in FIG. 2 (e.g., bumps 245, markers 299).

Figure 4:
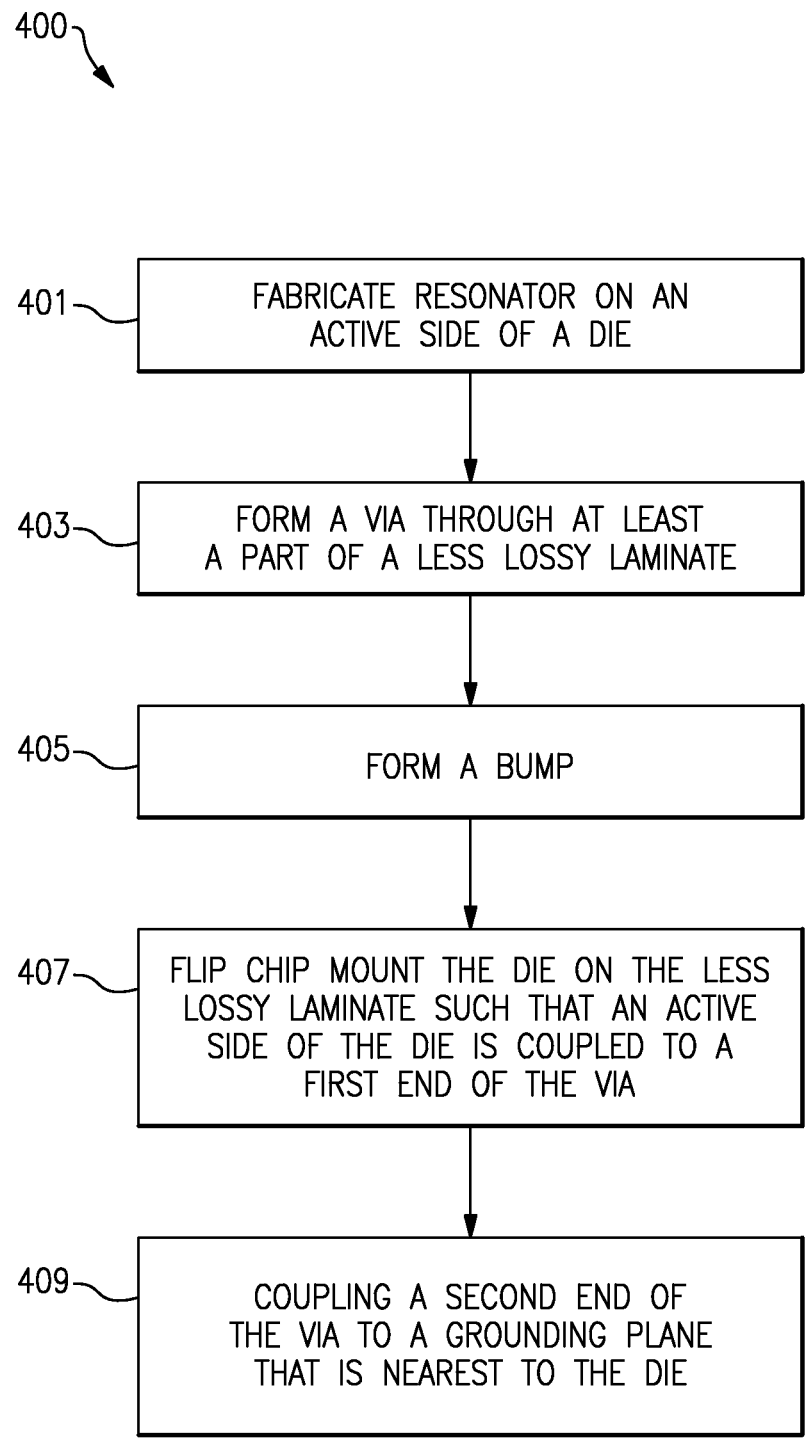
FIG. 4 shows an example block diagram of a method of manufacturing a resonator according to an embodiment.

FIG. 4 shows a block diagram of a method 400 of manufacturing a resonator according to an embodiment. At block 401, a resonator can be fabricated on an active side of a die. At block 403, a via can be formed through at least a part of a laminate substrate or any other suitable substrate having a lower loss than a semiconductor substrate of the die. The laminate substrate is less lossy than the substrate of the die. At block 405, a bump can be formed. The bump can be formed, for example, on the resonator or on the via, and it can couple the resonator to the via when the die is flip chip mounted. At block 407, the die can be flip chip mounted such that an active side of the die is coupled to a first end of the via. In some embodiments, the resonator in the active side of the die is coupled to the first end of the via. At block 409, a second end of the via is coupled to a ground plane. The ground plane can be the nearest ground plane to the die. The positioning of the via and the ground plane can be such that high frequency electromagnetic fields will concentrate in at least a part of the laminate substrate.

In some embodiments, the laminate substrate is part of a printed circuit board (PCB). The PCB can include the ground plane. In some embodiments, the ground plane and the active side of the die are on opposite sides of the laminate substrate. In some embodiments, at block 403, the via is formed through at least a part of the less lossy substrate such that the second end of the via is coupled to the ground plane. In some embodiments, at block 403, the via is formed through the less lossy substrate and a ground plane is coupled to the second end of the via. In some embodiments, other vias are coupled from parts of the active circuitry to the ground plane. In some embodiments, a plurality of vias are coupled from the resonator to the ground plane. In some embodiments, the resonator is fabricated as part of a monolithic microwave integrated circuit on the die. In some embodiments, the resonator is part of a VCO on the die.

Figure 5:
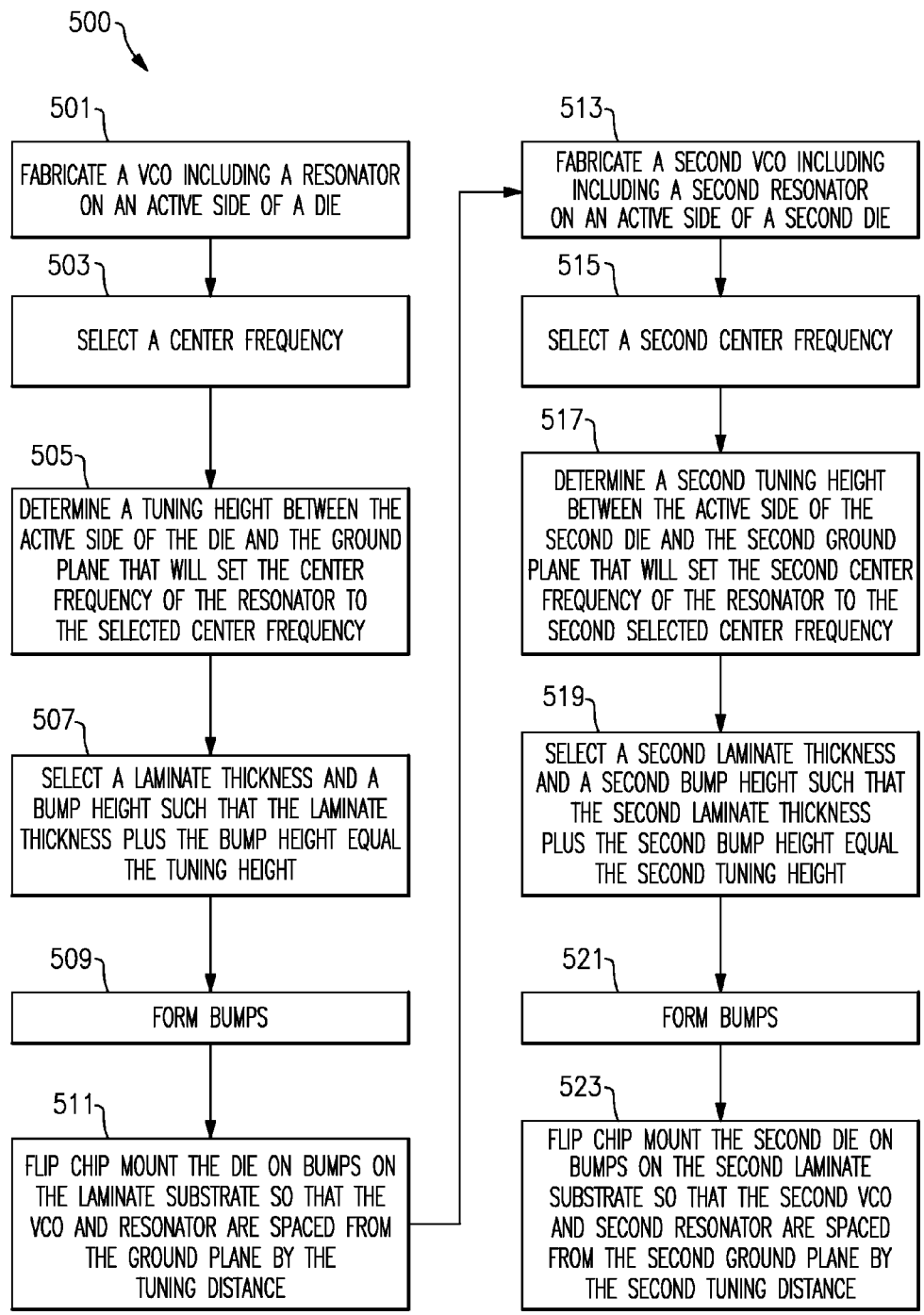
FIG. 5 shows an illustrative block diagram of a method of manufacturing a VCO according to an embodiment.

FIG. 5 shows an example block diagram of a method 500 of manufacturing a VCO according to an embodiment. The center frequency of a resonator that affects the output frequency of the VCO that is fabricated on a die can be impacted during the packaging process by the thickness of various packaging materials. This allows, for example, a single type circuit design to have different center frequencies when packaged differently. For example, a manufacturer can purchase a relatively large number (e.g., 1000) of the same VCO chips and put them in two or more different types of packages to make different products having different VCO center frequencies. It also allows, for example, fine-tuning of VCO circuits to achieve a desirable frequency. For example, if an entire wafer lot of VCO chips that have a center frequency slightly higher than designed due to imperfect fabrication, those VCO chips can be tuned when being packaged to bring the center frequency back within specification limits rather than being thrown away.

At block 501, a VCO including a resonator can be fabricated on an active side of a die. At block 503, a desired center frequency for the VCO can be selected. At block 505, a tuning height from the active side of the die to the ground plane can be determined. The tuning height can be the tuning height that will set the center frequency of the VCO to the selected center frequency.

Increasing the tuning height can lower the center frequency of the VCO, and decreasing the tuning height can increase the center frequency of the VCO. The changes in center frequency can result from an increased tuning height leading to more inductance and a decreased tuning height having a decreased inductance. A four percent change in the tuning height can cause approximately a one percent change in the center frequency in some implementations. In some embodiments, the total tuning height can be in a range between about 150 microns to about 450 microns. In some embodiments, the tuning height can be in a range between 50 microns to 750 microns. The tuning height can be any suitable height for a desired application.

At block 507, a laminate thickness and a bump height can be selected such that the laminate thickness plus the bump height correspond to the tuning height. With reference to FIG. 1, the laminate thickness 599 plus the bump height 598 equal the distance from the active circuit of the die 101 to the ground plane 123. In some embodiments that include parts of the ground plane extending in the laminate substrate, the laminate thickness can be measured to the ground plane.

At block 509, bumps can be formed. The bumps can be formed to have a height equal to the selected bump height. At block 511, the die can be flip chip mounted such that the bumps couple the die to the laminate substrate having a thickness of the selected laminate thickness. The VCO and resonator in the active side of the die can be spaced from the ground plane by the tuning distance.

At block 513, a second VCO including a second resonator can be fabricated on an active side of a second die. At block 515, a second desired center frequency for the second VCO can be selected. The second desired frequency of block 515 can be a different frequency from the center frequency of block 503. At block 517, a second tuning height from the active side of the second die to the second ground plane can be determined. The second tuning height can set the center frequency of the second VCO to the second selected center frequency. By using different tuning heights, dies that are substantially the same can be used to manufacture VCOs having different center frequencies.

At block 519, a second laminate thickness and a second bump height can be selected such that the second laminate thickness plus the second bump height correspond to the second tuning height.

At block 521, bumps can be formed. The bumps can be formed to have a height equal to the second selected bump height. At block 523, the second die can be mounted such that the bumps couple the second die to the second laminate substrate having a second thickness of the second selected laminate thickness. The second VCO and second resonator in the active side of the second die can be spaced from the second ground plane by the second tuning distance.

Some or all of the operations of the methods discussed herein can be performed in certain embodiments. The acts of the methods discussed herein can be performed in any order as appropriate. Moreover, the acts of the methods discussed herein can be performed serially or in parallel, as appropriate. Furthermore, any of the methods discuss herein can be performed in connection with manufacturing any of the devices discussed herein.

Figure 6:
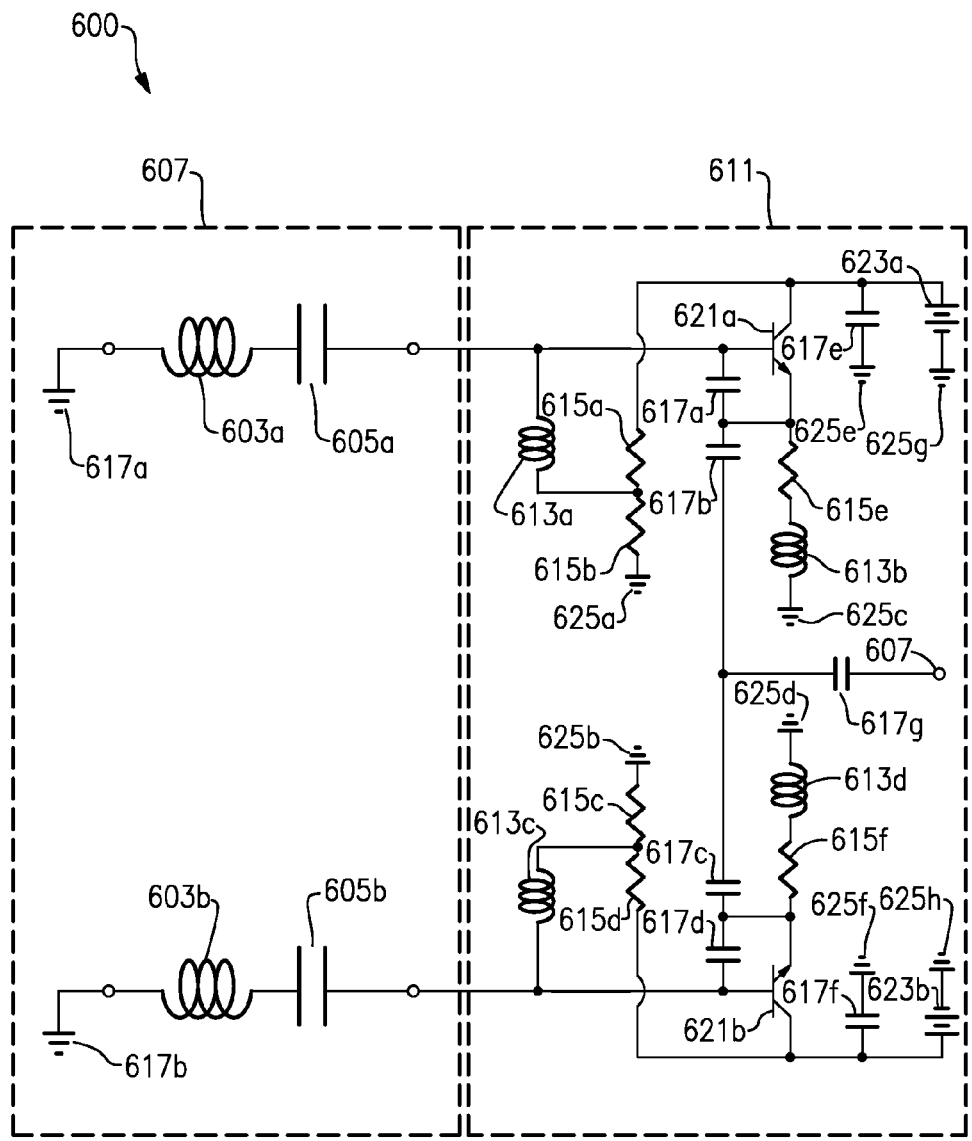
FIG. 6 shows a schematic of an illustrative resonator circuit according to an embodiment.

FIG. 6 shows a schematic 600 of an example VCO circuit according to an embodiment. A resonator section indicated by dotted lines 607 is coupled to an active circuit indicated by dotted lines 611 to form a Colpitts push-push style VCO. An oscillating signal can be output at 607.

As part of the oscillator section 607, inductor 603*a* is coupled in series between a ground 617*a* and a capacitor 605*a* to form a first LC resonator. Inductor 603*b* is coupled in series between ground 617*b* and capacitor 605*b* to form a second LC resonator. Grounds 617*a*, 617*b* can be the ground plane, such as ground plane 123 of FIG. 1, and can be coupled by way of vertical conductive pathways through at least a part of the laminate substrate such that the ground plane is separated from the rest of the oscillator circuitry by the laminate substrate, and relatively high frequency electromagnetic fields will concentrate in at least a part of the laminate substrate.

As part of the active section 611, power sources 623*a*, 623*b* that can be, for example, one or more batteries or some other form of a power supply can supply power to the circuit. A plurality of inductors 613*a*-613*d*, resistors 615*a*-615*f*, capacitors 617*a*-617*g*, and transistors 621*a*-621*b* can be arranged as shown to complete the VCO.

Various embodiments can apply different techniques for fabricating different types of electronic devices. Some embodiments apply to the fabrication of monolithic microwave integrated circuits (MMIC).

In the embodiments described above, apparatuses, systems, and methods for a MMIC with reduced noise and controlled frequency are described in connection with particular embodiments. It will be understood, however, that the principles and advantages of the embodiments can be used for any other systems, apparatus, or methods with resonators, with VCO's, with circuits that benefit from reduced phase noise, with circuits having adjustable center frequency, with circuits benefiting from improved heat dispersion, or with packaging dies. Although certain embodiments are described with reference to an example resonator, VCO, and laminate substrate, it will be understood that the principles and advantages described herein can be applied to a variety of applications. While some of the disclosed embodiments may be described with reference to a VCO as an active circuit, the principles and advantages discussed herein can be applied to other types of fixed oscillators, filters, or other suitable circuits that include a resonator. While the disclosed embodiments may be described with reference to certain pin and/or package layouts, the principles and advantages discussed herein can be applied to other types of pin and package layouts. Moreover, while some circuit schematics are provided for illustrative purposes, other equivalent circuits can alternatively be implemented to achieve the functionality described herein.

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, and disk driver circuits. Consumer electronic products can include, but are not limited to, wireless devices, a mobile phone (for example, a smart phone), healthcare monitoring devices, vehicular electronics systems such as automotive electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A packaged chip comprising:
a packaging substrate comprising a first side and a second side, the second side opposing the first side;
a die comprising:
a semiconductor substrate that is more lossy than the packaging substrate; and
a resonator circuit comprising microstrip lines, on an active side of the die, the active side facing the first side of the packaging substrate; and
a ground plane that is external to the die, the ground plane being separated from the resonator circuit by at least a portion of the packaging substrate, and the ground plane being electrically coupled to the die.

2. The packaged chip of claim 1, wherein the ground plane is the nearest ground plane to the resonator circuit.

3. The packaged chip of claim 1, wherein the die does not include any ground planes.

4. The packaged chip of claim 1, wherein the ground plane is positioned relative to the resonator circuit so as to concentrate radio frequency electromagnetic fields more in at least a portion of the packaging substrate than in the semiconductor substrate.

5. The packaged chip of claim 1, wherein the ground plane and the die are disposed on the opposite sides of the packaging substrate.

6. The packaged chip of claim 1, further comprising a packaging material in physical contact with a back side of the die, the back side of the die opposing the active side of the die.

7. The packaged chip of claim 1 further comprising a bump coupled to the active side of the die such that the active side of the die is separated from the packaging substrate.

8. The packaged chip of claim 1, wherein the packaging substrate is a laminate substrate.

9. The packaged chip of claim 1, wherein the packaging substrate comprises at least one of a glass material, a ceramic material, or a ferrite material.

10. The packaged chip of claim 1, wherein the semiconductor substrate comprises a doped silicon material, and wherein the resonator circuit is a strip resonator.

11. The packaged chip of claim 1, wherein the die comprises a microwave monolithic integrated circuit comprising a voltage controlled oscillator that comprises the resonator.

12. An electronic system comprising:
a resonator circuit on an active side of a microwave monolithic integrated circuit (MMIC) that comprises a semiconductor substrate;
a packaging substrate that is less lossy than the semiconductor substrate; and
a ground plane;
wherein a positioning of the ground plane relative to the resonator circuit is configured to concentrate microwave frequency electromagnetic fields more in at least a portion of the packaging substrate than in the semiconductor substrate.

13. The system of claim 12, wherein the MMIC is flip chip mounted so that the active side of the die faces the packaging substrate.

14. The system of claim 12, wherein the ground plane separated from the resonator circuit by at least a part of the packaging substrate.

15. The system of claim 14, wherein the ground plane and the resonator circuit are positioned on opposite sides of the packaging substrate.

16. The system of claim 12, further comprising a via extending through at least a portion of the packaging substrate, the via providing an electrical connection between the ground plane and the resonator circuit.

17. The system of claim 12, further comprising a bump coupled between the active side of the MMIC and the packaging substrate.

18. The system of claim 12, wherein the MMIC comprises a voltage controlled oscillator (VCO) that receives a signal from the resonator circuit, the VCO configured to output a signal that oscillates at a frequency that varies based, at least in part, on a voltage of an input signal.

19. A chip assembly method comprising:
providing a die comprising a resonator; and
flip chip mounting the die on a packaging substrate such that an active side of the die is electrically coupled to a ground plane external to the die by way of a via in the packaging substrate, wherein the packaging substrate has a lower loss than a semiconductor substrate of the die, wherein a distance from the ground plane to the resonator impacts a center frequency of the resonator, and wherein the ground plane is the nearest ground plane to the resonator.

20. The method of claim 19, further comprising:
providing a second die that is substantially the same as the die; and
flip-chip mounting the second die on a second packaging substrate such that an active side of the second die is electrically coupled to a second ground plane external to the second die by way of a via in the second packaging substrate, wherein the second packaging substrate has a lower loss than a semiconductor substrate of the second die, and wherein a second distance that separates a resonator of the second die from the second ground plane is different than the distance such that the resonator of the second die has a second center frequency that is different than the center frequency.

* * * * *